(12) United States Patent
Lee et al.

(10) Patent No.: US 10,355,016 B2
(45) Date of Patent: Jul. 16, 2019

(54) SEMICONDUCTOR DEVICE

(71) Applicant: Samsung Electronics Co., Ltd., Suwon-si (KR)

(72) Inventors: Young-suk Lee, Daejeon (KR); Tae-hee Lee, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/949,195

(22) Filed: Apr. 10, 2018

(65) Prior Publication Data

US 2019/0115358 A1   Apr. 18, 2019

(30) Foreign Application Priority Data

Oct. 16, 2017  (KR) ........................ 10-2017-0134246

(51) Int. Cl.
| | |
|---|---|
| *H01L 27/11578* | (2017.01) |
| *H01L 27/11582* | (2017.01) |
| *H01L 27/11524* | (2017.01) |
| *H01L 27/11556* | (2017.01) |
| *H01L 27/11519* | (2017.01) |
| *H01L 27/1157* | (2017.01) |
| *H01L 21/768* | (2006.01) |
| *H01L 23/522* | (2006.01) |
| *H01L 23/528* | (2006.01) |
| *H01L 23/00* | (2006.01) |
| *H01L 27/11565* | (2017.01) |

(52) U.S. Cl.
CPC .. *H01L 27/11582* (2013.01); *H01L 21/76816* (2013.01); *H01L 21/76877* (2013.01); *H01L 23/528* (2013.01); *H01L 23/5226* (2013.01); *H01L 23/562* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC ......... H01L 27/11582; H01L 21/76816; H01L 21/76877; H01L 27/11578
See application file for complete search history.

(56) References Cited

U.S. PATENT DOCUMENTS

| | | |
|---|---|---|
| 8,154,068 B2 | 4/2012 | Katsumata et al. |
| 9,099,349 B2 | 8/2015 | Kofuji et al. |
| 9,349,747 B2 | 5/2016 | Kim et al. |
| 9,530,792 B2 | 12/2016 | Kim et al. |
| 9,627,396 B2 | 4/2017 | Son et al. |
| 9,685,452 B2 | 6/2017 | Lee et al. |
| 2016/0049422 A1 | 2/2016 | Kim et al. |
| 2017/0104000 A1 | 4/2017 | Park et al. |

*Primary Examiner* — Errol V Fernandes
(74) *Attorney, Agent, or Firm* — Muir Patent Law, PLLC

(57) ABSTRACT

A semiconductor device including: a substrate including a top surface configured to extend in a first direction and a second direction that are perpendicular to each other; gate stack structures disposed on the substrate, spaced apart from one another in the first direction and configured to extend in the second direction; a first region in which levels of top surfaces of the gate stack structures are constant; a second region in which levels of top surfaces of the gate stack structures are stepped, the second region configured to surround at least a portion of the first region; and conductive lines disposed in the second region between the gate stack structures and configured to extend in the second direction in an uneven form.

18 Claims, 18 Drawing Sheets

SEMICONDUCTOR DEVICE

CROSS-REFERENCE TO RELATED APPLICATION

This application claims the benefit of priority under 35 U.S.C. § 119 to Korean Patent Application No. 10-2017-0134246, filed on Oct. 16, 2017, in the Korean Intellectual Property Office, the disclosure of which is incorporated herein in its entirety by reference.

BACKGROUND

The disclosure relates to a semiconductor device, and more particularly, to a vertical-type semiconductor memory device.

In order to achieve excellent performance and a reduced economical cost, an increase in a degree of integration of semiconductor devices is required. In particular, a degree of integration of semiconductor memory devices is a significant factor in determining prices of products. A degree of integration of two-dimensional semiconductor memory devices according to the related art is primarily determined by the area of unit memory cells, and thus is greatly affected by the level of technology for forming fine patterns. However, high-priced equipment is used to form fine patterns, and the area of a chip die is limited. Thus, the degree of integration of the two-dimensional semiconductor memory devices is increasing but is still limited. Thus, vertical-type semiconductor memory devices having a three-dimensional (3D) structure are increasingly in demand.

SUMMARY

The disclosure provides a vertical-type semiconductor memory device having improved reliability and improved economic feasibility of manufacture.

According to certain embodiments, the disclosure is directed to a semiconductor device comprising: a substrate comprising a top surface extending in a first direction and a second direction that are perpendicular to each other; gate stack structures disposed on the substrate, spaced apart from one another in the first direction, and extending in the second direction; a first region in which levels of top surfaces of the gate stack structures are constant; a second region in which levels of top surfaces of the gate stack structures are stepped, the second region surrounding at least a portion of the first region; and conductive lines disposed in the second region between the gate stack structures and including first linear segments extending in the first direction and second linear segments extending in the second direction.

According to certain embodiments, the disclosure is directed to a semiconductor device comprising: a substrate comprising a cell array region and a contact connection region that surrounds the cell array region; gate stack structures spaced apart from one another in a first direction parallel to a top surface of the substrate; and common source lines disposed in a space defined by two adjacent gate stack structures of the gate stack structures, wherein, in the contact connection region, vertical levels of top surfaces of the gate stack structures sequentially decrease as a distance from the cell array region increases, and the gate stack structures have lateral sides that extend in a second direction perpendicular to the first direction and include rectangular protrusions and depressions, and wherein levels of top surfaces of the common source lines are constant and are formed in accordance with shapes of the lateral sides of the gate stack structures.

According to certain embodiments, the disclosure is directed to a semiconductor device comprising: a substrate comprising a top surface that extends in a first direction and a second direction perpendicular to the first direction; vertical structures configured to extend in a third direction perpendicular to the top surface of the substrate; word lines configured to surround the vertical structures and stacked so as to be spaced apart from one another in the third direction; and conductive lines configured to vertically intersect the word lines and having first lateral sides that extend in the first direction, second lateral sides that extend in the second direction, and top surfaces that extend in a flat form in a contact region, the contact region being an area in which a number of stacks of the word lines decreases.

BRIEF DESCRIPTION OF THE DRAWINGS

Embodiments will be more clearly understood from the following detailed description taken in conjunction with the accompanying drawings in which.

DETAILED DESCRIPTION

Hereinafter, embodiments will be described with reference to the attached drawings in detail.

Figure 1:
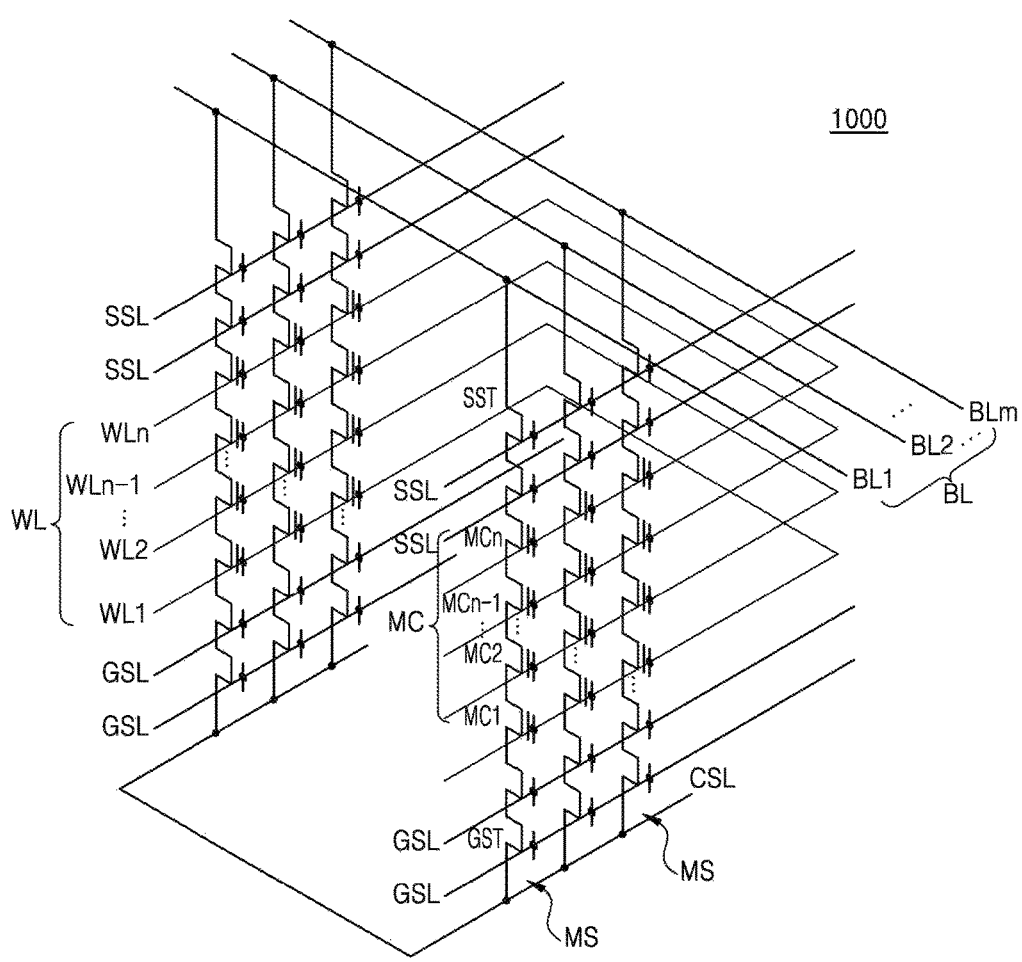
FIG. 1 is an equivalent circuit diagram of a cell array of a vertical-type semiconductor memory device, according to an exemplary embodiment.

FIG. 1 is a circuit diagram of a cell array of a vertical type semiconductor memory device, according to an example embodiment.

Referring to FIG. 1, a cell array 1000 may include a plurality of memory cell strings MS. The cell array 1000 includes a plurality of bit lines (BL) BL1, BL2, . . . , and BLm, a plurality of word lines (WL) WL1, WL2, . . . , WLn-1, and WLn, at least one string select line (SSL), at least one ground select line (GSL), and a common source line (CSL). A plurality of memory cell strings (MS) are formed between the plurality of bit lines (BL) BL1, BL2, . . . , and BLm and the common source line (CSL).

Each of the plurality of memory cell strings (MS) includes a string select transistor (SST), a ground select transistor (GST), and a plurality of memory cell transistors (MC) MC1, MC2, . . . , MCn-1, and MCn. Drain regions of the string select transistor (SST) are connected to the bit lines (BL) BL1, BL2, . . . , and BLm, and source regions of the ground select transistor (GST) are connected to the common source line (CSL). The common source line (CSL) is a conductive line formed in a common source region to which source regions of a plurality of ground select transistors (GSTs) are commonly connected. Detailed descriptions of the common source line (CSL) will be provided later.

The string select transistor (SST) may be connected to the string select line (SSL), and the ground select transistor (GST) may be connected to the ground select line (GSL). Also, the plurality of memory cell transistors (MC) MC1, MC2, . . . , MCn-1, and MCn may be respectively connected to the word lines (WL) WL1, WL2, . . . , WLn-1, and WLn.

The cell array 1000 may be arranged in a three-dimensional (3D) structure. The plurality of memory cell transistors (MC) MC1, MC2, . . . , MCn-1, and MCn that constitute the memory cell string (MS) may have a structure in which they are connected to each other in series perpendicularly to a top surface of a substrate (see 100 of FIG. 3). Thus, channel regions of each of the string select transistor (SST), the ground select transistor (GST), and the plurality of memory cell transistors (MC) MC1, MC2, . . . , MCn-1, and MCn may extend substantially perpendicularly to the top surface of the substrate (see, e.g., substrate 100 of FIG. 3). As used herein, items described as being "connected" may refer to an electrical connection such that an electrical signal can be passed from one item to the other. For example, an electrically conductive component (e.g., a wire, pad, internal electrical line, etc.) physically connected to another electrically conductive component (e.g., a wire, pad, internal electrical line, etc.) may also be electrically connected to that component to allow communications of electrical signals therebetween.

Figure 2:
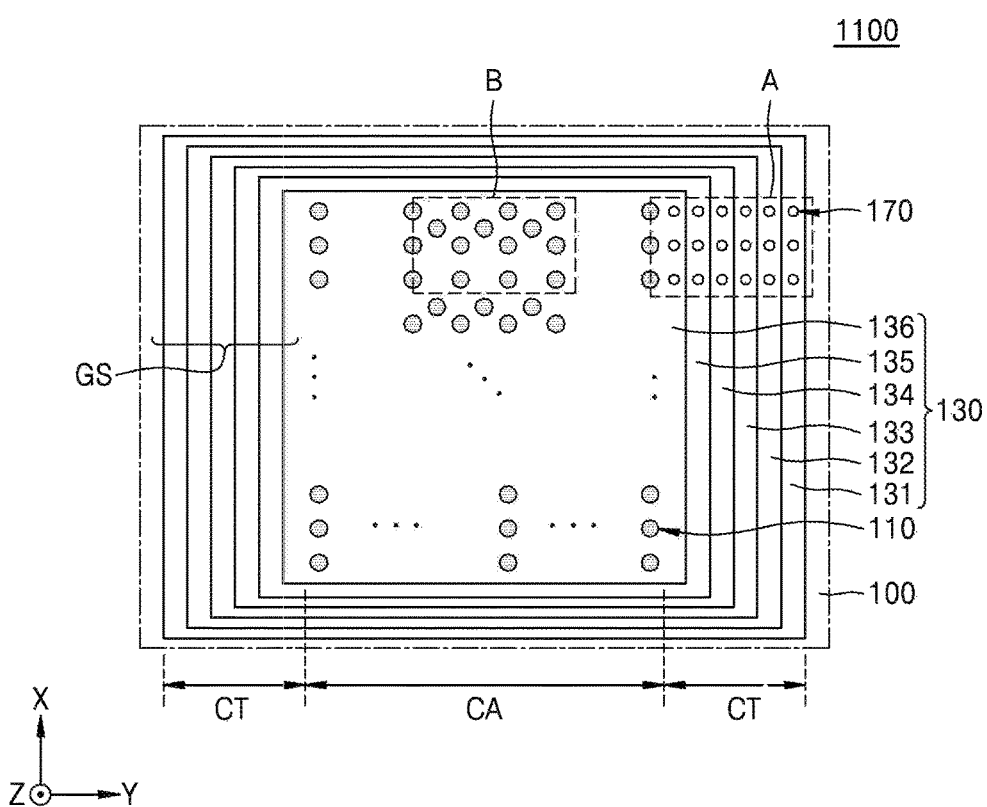
FIG. 2 is a schematic plan view of a cell region of a semiconductor device, according to an exemplary embodiment.

FIG. 2 is a schematic plan view of a cell region of a semiconductor device, according to an example embodiment.

Referring to FIG. 2, a cell region 1100 may include a cell array region CA and a contact connection region CT that surrounds the cell array region CA.

The semiconductor device may include the cell region 1100 and a peripheral circuit region (not shown). A gate stack structure GS is formed in the cell region 1100 and includes a structure in which a plurality of gate electrode layers 130 (e.g., gate electrode layers 131 to 136) are stacked. The plurality of gate electrode layers 131 to 136 may be stacked in a third direction (Z-direction) perpendicular to the substrate 100, which includes the top surface of the substrate 100 that extends in a first direction (X-direction) and a second direction (Y-direction) that are perpendicular to each other. The plurality of gate electrode layers (131 to 136) may correspond to word lines (WL), the string select line (SSL), and/or the ground select line (GSL), as described above in FIG. 1.

The gate stack structure GS may include a channel structure 110 that extends in the third direction (Z-direction) and contact plugs 170 that are connected to the plurality of gate electrode layers 131 to 136 and extend in the third direction (Z-direction).

A plurality of insulating layers (see, e.g., insulating layers 140 of FIG. 3) may be disposed under and/or on each of the plurality of gate electrode layers 131 to 136. The area of the plurality of gate electrode layers 131 to 136 may be reduced as far away from the third direction (Z-direction) from the top surface of the substrate 100. For example, a surface area (as measured by the lengths in the X- and Y-directions) of individual ones of the vertically stacked plurality of gate electrode layers 130 may incrementally decrease from the bottommost one of the gate electrode layers 130 to the topmost one of the plurality of gate electrode layers 130, such that the area of each gate electrode layer 130 progressively decreases the closer the gate electrode layer 130 is to the top of the gate stack structure GS. Thus, edge regions of the gate stack structure GS may have a step shape. For example, the vertical height (as measured in the Z-direction) of the gate stack structure GS in the contact region CT may gradually decreasing with increasing distance from the cell array region CA into the contact connection region CT. Contact plugs 170 may be formed in the edge region of the gate stack structure GS, and the plurality of gate electrode layers 131 to 136 may be connected to a wiring line via the contact plugs 170 and may receive electrical signals from a peripheral circuit region (not shown). The edge region of the gate stack structure GS having the step shape with the contact plugs 170 may be referred to as a contact connection region CT.

The channel structure 110 may pass through the plurality of gate electrode layers 131 to 136 and may be connected to the substrate 100. Although not shown, one or more word lines cut may be disposed between the channel structures 110 and between the contact plugs 170, and the word line cuts may be spaced apart from each other in the first direction (X-direction) and may extend in the second direction (Y-direction). By using the word line cut, the gate stack structure GS may be divided into a plurality of structures that are spaced apart from each other in the first direction (X-direction). The common source line (CSL) described above in FIG. 1 may be formed in a region in which the word line cut is formed. Detailed descriptions thereof will be provided later. The plurality of gate electrode layers 131 to 136 and the channel structure 110 may constitute a 3D cell array, and a semiconductor device including the 3D cell array may be referred to as a vertical type semiconductor memory device.

In the drawings, the gate stack structure GS includes first through sixth gate electrode layers 131 to 136. However, embodiments are not limited thereto. The number of gate electrode layers may be changed according to the structure of a memory cell string (see, e.g., memory cell string MS of FIG. 1) included in the 3D cell array.

Figure 3:
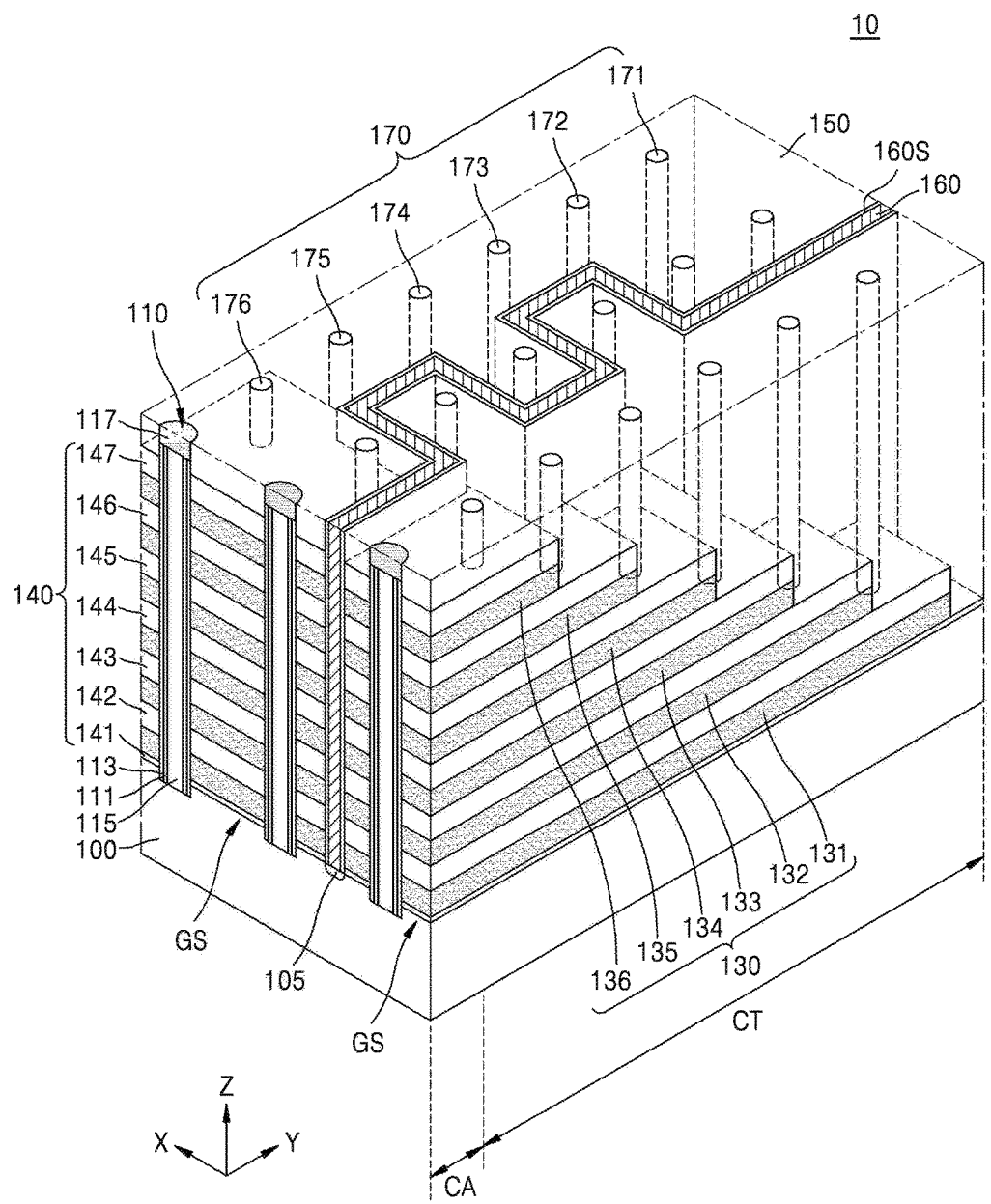
FIG. 3 is an enlarged perspective view of portion A of FIG. 2 illustrating a common source line in a contact connection region of the semiconductor device, according to an exemplary embodiment.

FIG. 3 is an enlarged perspective view of a portion A of FIG. 2 so as to represent a common source line in a contact connection region of the semiconductor device, according to an example embodiment.

Referring to FIG. 3, a semiconductor device 10 may include a substrate 100 in which a cell array region CA and a contact connection region CT adjacent to the cell array region CA are defined.

The substrate 100 may include silicon (Si), for example, crystalline Si, polycrystalline Si, or amorphous Si. In other embodiments, the substrate 100 may include a compound semiconductor, such as germanium (Ge), silicon germanium (SiGe), silicon carbide (SiC), gallium arsenide (GaAs), indium arsenide (InAs), or indium phosphide (InP). In some embodiment, the substrate 100 may include a conductive region, for example, a well with a doped impurity or a structure with a doped impurity. A semiconductor integrated circuit (IC) may be included in the substrate 100. The semiconductor IC may include at least one selected from the group consisting of a transistor, a diode, a capacitor, and a resistor.

The substrate 100 may include a top surface that extends in a first direction (X-direction) and a second direction (Y-direction) that are perpendicular to each other. The semiconductor device 10 may include a plurality of gate electrode layers 130 (e.g., gate electrode layers 131 to 136) stacked on the substrate 100 in a third direction (Z-direction) and a plurality of insulating layers 140 (e.g., insulating layers 141 to 147) disposed between the plurality of gate electrode layers 131 to 136. The plurality of gate electrode layers 131 to 136 and the plurality of insulating layers 141 to 147 may extend along the second direction (Y-direction).

A plurality of channel structures 110 that pass through the plurality of gate electrode layers 130 and the plurality of insulating layers 140 may be disposed in the cell array region CA. Each of the channel structures 110 may include a channel region 111, a gate dielectric layer 113, a buried insulating layer 115, and an upper conductive layer 117.

The channel region 111 may be formed in an opening having a circular cross-section, and a buried insulating layer 115 may be disposed in a ring-shaped channel region 111 having a middle hollow. For example, the buried insulating layer 115 may have a cylindrical shape, and the ring-shaped channel region 111 may conformally surround the buried insulating layer 115. The upper conductive layer 117 may be formed on the channel region 111, and a bit line (not shown) may be connected to the channel region 111 via the upper conductive layer 117.

A gate dielectric layer 113 including a blocking layer, a charge-storing layer, and a tunneling layer may be disposed between the channel region 111 and the gate electrode layers 130. In some embodiments, the gate dielectric layer 113 may be disposed outside the channel region 111 to extend in the third direction (Z-direction) in parallel to the channel region 111. For example, the gate dielectric layer 113 may conformally surround the channel region 111, along a vertical length of the channel region 111. In other embodiments, all elements of the gate dielectric layer 113 may be disposed to surround the gate electrode layers 130, or a first portion of the gate dielectric layer 113 may extend in the third direction (Z-direction) in parallel to the channel region 111 and may be disposed outside the channel region 111, and a second portion of the gate dielectric layer 113 may be disposed to surround the gate electrode layers 130.

A step-shaped region may be included in the gate electrode layers 130 and an insulating layer 140, which are alternately stacked in different positions in the third direction (Z-direction). In the drawing, the insulating layer 140 is disposed in an upper position than the corresponding gate electrode layer 130 along the third direction (Z-direction). For example, for each pair of one gate electrode layer 130 and one insulating layer 140 that have the same horizontal length or surface area, the insulating layer 140 may be disposed above the corresponding gate electrode layer 130. However, contrary to this, the gate electrode layer 130 may be disposed in an upper position than the corresponding insulating layer 140. For example, for each pair including one gate electrode layer 130 and one insulating layer 140 having the same horizontal length or surface area, the gate electrode layer 130 may be disposed above the corresponding insulating layer 140.

A plurality of contact plugs 170 (e.g., contact plugs 171 to 176) may be disposed in the contact connection region CT and may pass through a molding insulating layer 150 and the insulating layer 140 and may be respectively connected to the plurality of gate electrode layers 131 to 136. The plurality of contact plugs 171 to 176 may extend along the third direction (Z-direction) and may include a material having high conductivity, like in the gate electrode layers 130. In some embodiment, the contact plugs 170 may include the same material as a material for forming the gate electrode layers 130, and the plurality of contact plugs 171 to 176 formed in same positions in the second direction (Y-direction) may be electrically connected to each other via a connection line (not shown). For example, when viewed in a plan view, a connection line (not shown) extending in the Y-direction may electrically connect the plurality of contact plugs 171 to 176 that are aligned with one another in the Y-direction.

Conductive lines 160 may be integrally formed in such a way that the conductive lines 160 pass through the gate electrode layers 130 and the insulating layer 140 in the third direction (Z-direction) and are connected to source regions 105 of the substrate 100. The conductive lines 160 may extend in the second direction (Y-direction) in an uneven form while having the same height in the third direction (Z-direction). For example, in some embodiments, the conductive lines 160 may have first linear portions extending entirely in the Y-direction and second linear portions extending entirely in the X-direction, with the first and second linear portions having the same height in the Z-direction. Although it will be described later in FIG. 4, a plurality of conductive lines 160 may be spaced apart from each other in the first direction (X-direction) by a predetermined distance. The uneven shape of the conductive lines 160 may have rectangular protrusions and depressed portions defined between the protrusions.

By using the conductive lines 160, the gate electrode layers 130 and the insulating layer 140 may be divided into each gate stack structure GS. Also, the conductive line 160 may constitute the common source line CSL. The source regions 105 in which an impurity is doped into the substrate 100, may be under the conductive lines 160. The conductive lines 160 may include a metal, such as tungsten (W), aluminum (Al), or copper (Cu).

A spacer 160S may be ambilaterally disposed between the conductive lines 160 and the gate electrode layers 130. By using the spacer 160S, the gate electrode layers 130 and the conductive lines 160 may be electrically insulated from each other. For example, the spacer 160S may be disposed on both sides of the conductive lines 160, electrically insulating the conductive lines 160 from the gate electrode layers 130.

Because the conductive lines 160 have a considerably larger length that extends in the second direction (Y-direction) and a height in the third direction (Z-direction) than a width in the first direction (X-direction), structural problems, such as a collapse phenomenon, may occur. In order to solve this issue, the conductive lines 160 may be formed in uneven patterns so that the collapse phenomenon of the conductive lines 160 may be prevented from occurring. For example, a structural integrity of the conductive lines 160 is improved when the conductive lines 160 have first portions extending entirely in the Y-direction and second portions extending entirely in the X-direction.

Also, a region in which the conductive lines 160 are disposed may correspond to the word line cut previously described in FIG. 2. The word line cut may be formed in an uneven form in the contact connection region CT so that a relatively large open region compared to the case where the word line cut is formed in a straight line, may be formed. For example, in the contact connection region CT, the word lines cuts may have first portions extending entirely in the Y-direction and second portions extending entirely in the X-direction, increasing the volume of open areas relative to embodiments in which all portions of the word line cuts extend entirely in the Y-direction. Thus, the material for forming the gate electrode layers 130 may be easily formed. As a result, according to certain disclosed embodiments, the semiconductor device 10 having improved reliability of a device and improved economic feasibility of manufacture may be provided.

Figure 4:
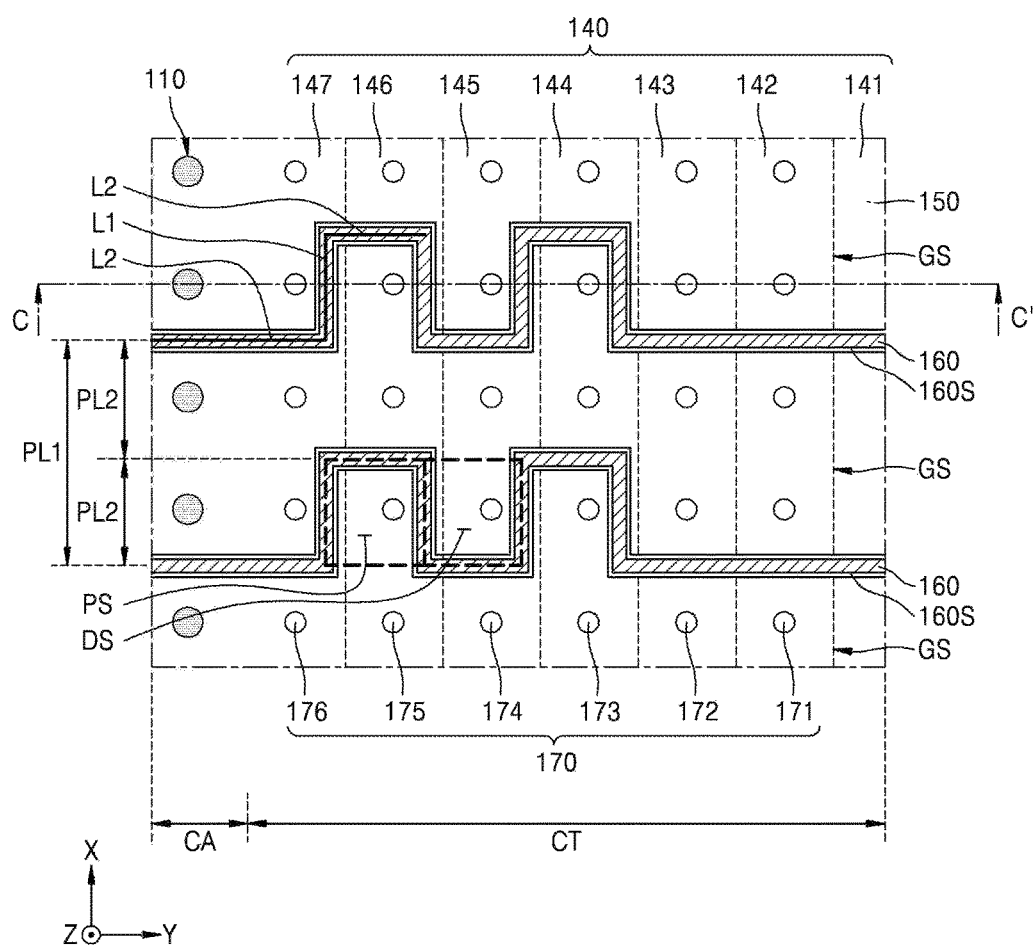
FIG. 4 is a plan view of a contact connection region of the semiconductor device, according to an exemplary embodiment.

FIG. 4 is a plan view of a contact connection region of the semiconductor device, according to an example embodiment.

Referring to FIGS. 3 and 4, the semiconductor device 10 may include a cell array region CA in which the plurality of channel structures 110 are disposed, and a plurality of contact plugs 171 to 176 that pass through second through seventh insulating layers 142 to 147 and are electrically connected to the plurality of gate electrode layers 131 to 136.

A length to which each of the plurality of gate electrode layers 131 to 136 extends in the second direction (Y-direction), may gradually decrease by a predetermined length in a direction toward a sixth gate electrode layer 136 disposed in a topmost position in the third direction (Z-direction) from the first gate electrode layer 131 disposed in a bottommost position in the third direction (Z-direction). For example, a length in the X-direction of individual ones of the gate electrode layers 130 may incrementally decrease from the bottommost one of the stacked gate electrode layers 130 (e.g., gate electrode layer 131) to the topmost one of the stacked gate electrode layers 130 (e.g., gate electrode layer 136), such that the length in the X-direction of each gate electrode layer 130 progressively decreases the closer the gate electrode layer 130 is to the top of the stacked gate structure GS. As an extension length in one direction is gradually decreased as getting closer to the topmost, sixth gate electrode layer 136 from the bottommost, first gate electrode layer 131, each of the plurality of gate electrode layers 131 to 136 may form a step height having a step shape with other gate electrode layers 130 adjacent to each other in a stack direction of the gate electrode layers 130.

A plurality of conductive lines 160 may be disposed on the substrate 100. The plurality of conductive lines 160 may be disposed between the gate stack structures GS that extend in the second direction (Y-direction) and spaced apart from each other in the first direction (X-direction), and may extend in the second direction (Y-direction) in a changing form. The conductive lines 160 may be integrally disposed between the gate stack structures GS. The changing shape may be an integral shape in which constituent segments of the conductive lines 160 that extend along first straight lines L1 in the first direction (X-direction) and constituent segments of the conductive lines 160 that extend along second straight lines L2 in the second direction (Y-direction) are alternately and substantially connected to one another at a right angle and thus have protrusions PS and depression DS each having a rectangular shape. For example, each of the constituent segments of the conductive lines 160 may be linear segments and, when three sequential linear segments are connected together, rectangular-shaped protrusions PS and depressions DS are formed. For each protrusion PS and depression DS, the conductive lines 160 may span one contact plug 170 in the X-direction and two contact plugs 170 in the Y-direction.

Here, the protrusions PS may refer to a region having different coordinates from coordinates of the conductive lines 160 in the first direction (X-direction) that extend from the cell array region CA, and the depressions DS may refer to a region defined between the adjacent protrusions PS. For example, in the cell array region CA, the Y-coordinates of the conductive lines 160 may remain the same for the entire length of the conductive lines 160 in the cell array region CA. In the contact connection region CT, the Y-coordinates of the conductive lines 160 may change such that the regions forming the protrusions PS may have Y-coordinates that are increasing and greater than the Y-coordinates in the cell array region CA and the regions forming the depressions DS may be Y-coordinates that are decreasing to the same as the Y-coordinates in the cell array region CA.

Thus, the gate electrode layers 130 may face at least three surfaces of one from among the conductive lines 160. For example, the conductive lines 160 have a shape in which they extend not in a straight line but in an uneven form, so that the area of the conductive lines 160 facing and in contact with the gate electrode layers 130 may be increased. In the example of FIG. 4, the gate electrode layers 130 face surfaces corresponding to each of the linear segments.

Also, the plurality of conductive lines 160 may be spaced apart from one another in the first direction (X-direction) by a first distance PL1. Virtual first straight lines L1 that connect the second straight lines L2, may have a length in the first direction (X-direction) that is the same as the second distance PL2 and may be spaced apart from one another in the first direction (X-direction) by the same second distance PL2. For example, the conductive lines 160 may be spaced apart from one another in the first direction (X-direction) by the first distance PL1 that is twice the second distance PL2.

Contact plugs 170 may be disposed on the gate electrode layers 130 in the contact connection region CT along the straight lines in the second direction (Y-direction).

Also, the conductive lines 160 may be disposed in such a way that at least one of the contact plugs 170 disposed along the straight lines in the second direction (Y-direction) crosses the conductive line 160 in the first direction (X-direction). For example, the conductive lines 160 may be interposed between the contact plugs 170 in the first direction (X-direction) and the second direction (Y-direction).

However, even though the conductive lines 160 are formed in a square-wave form in the contact connection region CT (when viewed in a plan view), this may not affect the arrangement of the contact plugs 170.

Figure 5:
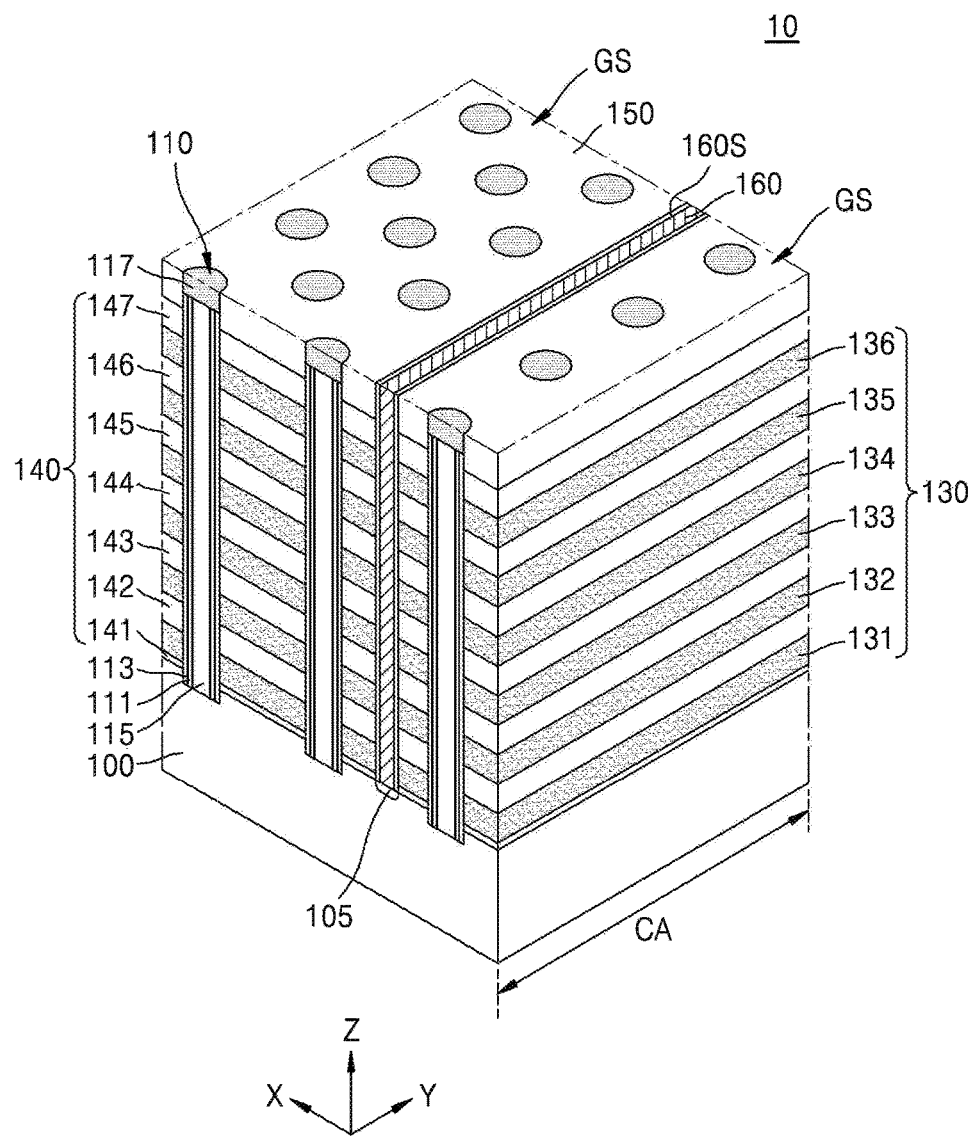
FIG. 5 is an enlarged perspective view of portion B of FIG. 2 illustrating a common source line in a cell array region of the semiconductor device, according to an exemplary embodiment.
Figure 6:
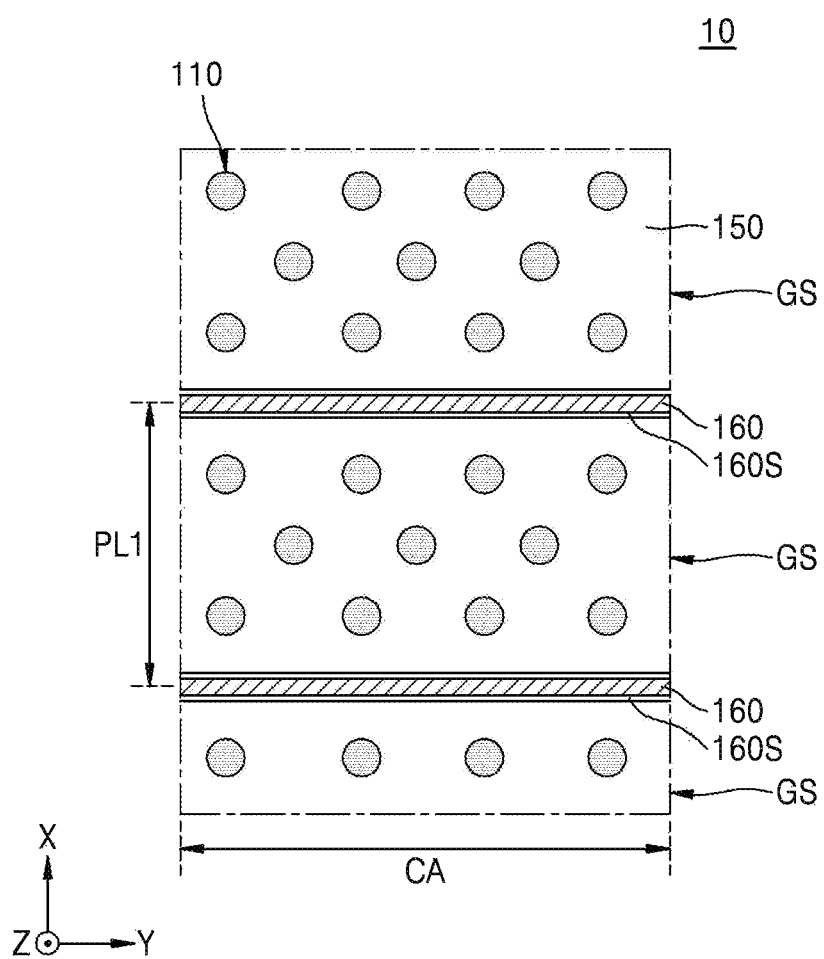
FIG. 6 is a plan view of a cell array region of the semiconductor device, according to an exemplary embodiment.

FIG. 5 is an enlarged perspective view of a portion B of FIG. 2 so as to represent a common source line in the cell array region CA of the semiconductor device, according to an example embodiment, and FIG. 6 is a plan view of the cell array region CA of the semiconductor device.

Referring to FIGS. 5 and 6, in the cell array region CA, a plurality of channel structures 110 may be disposed in the third direction (Z-direction) perpendicular to the top surface of the substrate 100, the plurality of insulating layers 141 to 147 and the plurality of gate electrode layers 131 to 136 stacked along outsides of the plurality of channel structures 110. The plurality of channel structures 110 may be arranged in columns and rows.

The plurality of channel structures 110 may be spaced apart from one another in the first direction (X-direction) and the second direction (Y-direction) and may be disposed to form columns in zigzag and/or straight lines along the second direction (Y-direction). However, the arrangement of the plurality of channel structures 110 may be diverse according to an embodiment and is not limited thereto. Also, one or more of the plurality of channel structures 110 may be a dummy channel structure.

Conductive lines 160 may be disposed to cross the plurality of channel structures 110 and extend in the second direction (Y-direction). The conductive lines 160 may extend in the form of straight lines in the cell array region CA. For example, unlike in the contact connection region CT previously described in FIG. 3, the conductive lines 160 may not be formed in an uneven form. For example, in the cell array region CA, the conductive lines 160 may have a linear shape. Thus, in the cell array region CA, the gate electrode layers 130 may face one surface of a single conductive line 160 from among the conductive lines 160.

In the cell array region CA, as in the contact connection region (see, e.g., contact connection region CT of FIG. 3), the conductive lines 160 may be spaced apart from one another in the first direction (X-direction) while having the first distance PL1.

For example, in the contact connection region (see, e.g., contact connection region CT of FIG. 3), the conductive lines 160 extend in an uneven form so that a collapse phenomenon of the conductive lines 160 may be prevented from occurring. Unlike this, in the cell array region CA, the conductive lines 160 extend in the form of straight lines. The gate stack structure GS may also be formed to extend in the form of straight lines so that the number of the channel structures 110 per unit area may not vary.

FIGS. 7A through 7I are cross-sectional views for explaining a method of fabricating a semiconductor device, according to an example embodiment.

Figure 7A:
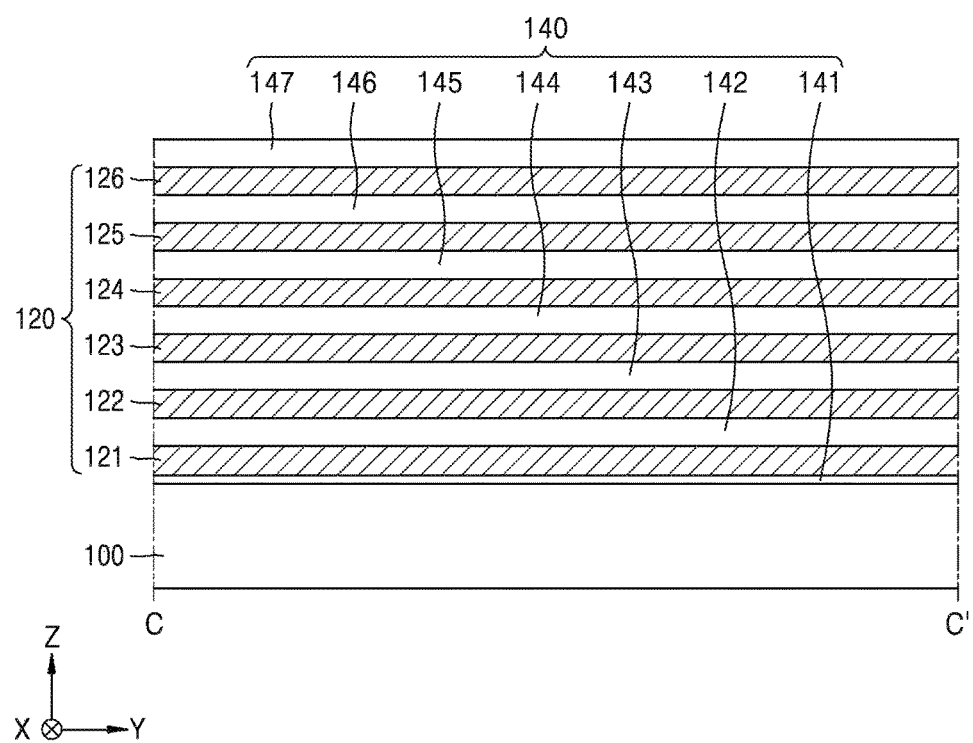
FIGS. 7A through 7I are cross-sectional views for explaining a method of fabricating a semiconductor device, according to an exemplary embodiment.
Figure 7B:
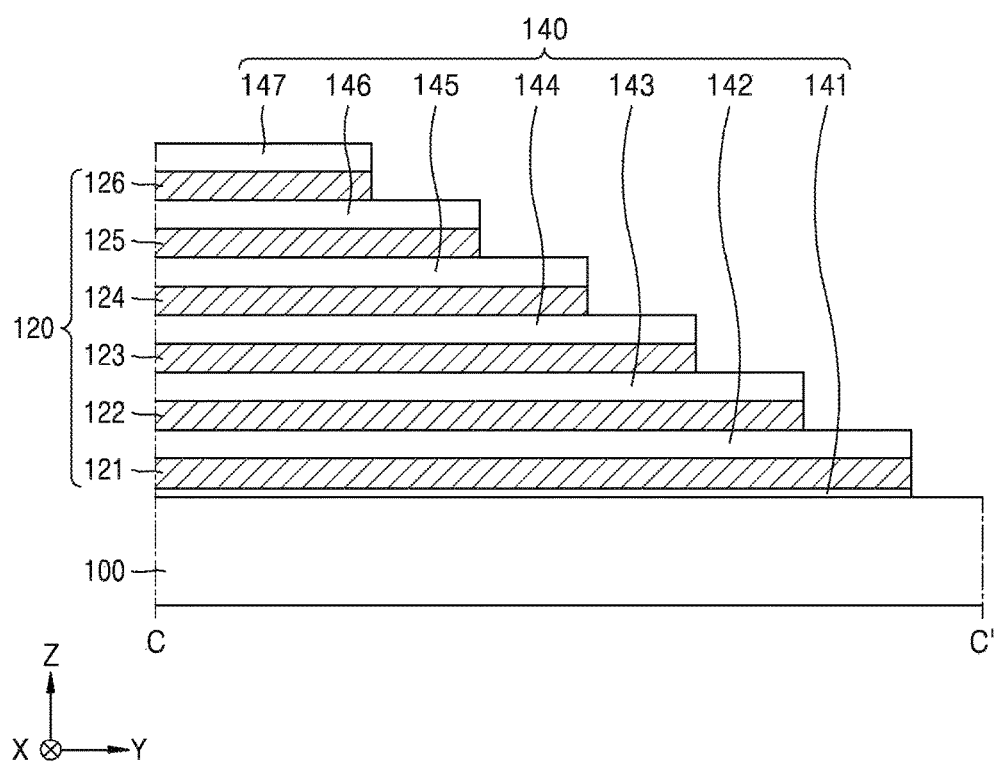

FIGS. 7A, 7B, . . . , and 7I are cross-sectional views of regions corresponding to a cross-section of line C-C' of FIG. 4.

Referring to FIG. 7A, a plurality of insulating layers 140 (e.g., insulating layers 141 to 147) and a plurality of sacrificial layers 120 (e.g., sacrificial layers 121 to 126) are alternately stacked on the substrate 100.

The description of the substrate 100 is the same as the above description of FIG. 3 and thus, redundant descriptions thereof will be omitted. The substrate 100 may include a top surface that extends in the first direction (X-direction) and the second direction (Y-direction) that are perpendicular to each other. The substrate 100 may include the plurality of insulating layers 141 to 147 and the plurality of sacrificial layers 121 to 126, which are stacked on the substrate 100 along the third direction (Z-direction). The plurality of insulating layers 141 to 147 and the plurality of sacrificial layers 121 to 126 may extend along the second direction (Y-direction).

In some embodiment, a lower structure (not shown) including at least one transistor may be disposed between the sacrificial layers 120, the insulating layers 140 and the substrate 100. For example, a lower structure may be disposed between the substrate 100 and the lowest one of the sacrificial layer 120 or the insulating layer 140. In the present specification, for easier understanding, an example embodiment in which the sacrificial layers 120 and the insulating layers 140 are formed directly on the substrate 100 will be illustratively described. However, embodiments are not limited thereto.

The sacrificial layers 120 may be formed of a material having etch selectivity with respect to the insulating layers 140. For example, the sacrificial layers 120 may be formed of a material in which etching of the insulating layers 140 may be minimized in an operation of etching the sacrificial layers 120. This etch selectivity may be represented in a quantitative manner through a ratio of an etching speed of the sacrificial layers 120 with respect to an etching speed of the insulating layers 140. The insulating layers 140 may be formed of a material selected from the group consisting of a silicon oxide layer, a silicon nitride layer, and a silicon oxynitride layer, and the sacrificial layers 120 may be formed of a material selected from the group consisting of a silicon oxide layer, a silicon nitride layer, a silicon oxynitride layer, and silicon carbide, which is different from the material for forming the insulating layers 140. For example, when the sacrificial layers 120 are a silicon nitride layer, the insulating layers 140 may be a silicon oxide layer.

In an embodiment, thicknesses of the plurality of insulating layers 141 to 147 may be different from each other. For example, a first insulating layer 141 disposed in a bottommost position in the third direction (Z-direction) from among the plurality of insulating layers 141 to 147 may have a relatively small thickness compared to the other insulating layers 142 to 147, and a seventh insulating layer 147 disposed in a topmost position may have a relatively large thickness compared to the other insulating layers 141 to 146. For example, the thicknesses of the sacrificial layers 120 and the insulating layers 140 are not limited to illustration of the drawings but may be modified in various manners, and the number of layers for forming the sacrificial layers 120 and the insulating layers 140 may also be changed in various ways.

Referring to FIG. 7B, a plurality of sacrificial layers 121 to 126 and a plurality of insulating layers 141 to 147, which are alternately stacked on the substrate 100, may be etched to form a step shape. For example, sets consisting of one or more of the sacrificial layers 121 to 126 and one or more of the plurality of insulating layers 141 to 147 may be etched to have different lengths in the Y-direction.

In order to form a step height between the sacrificial layer 120 and the insulating layer 140 adjacent to each other in the third direction (Z-direction), a predetermined etching mask (not shown) may be formed on the plurality of sacrificial layers 121 to 126 and the plurality of insulating layers 141 to 147, which are alternately stacked on the substrate 100, and the exposed sacrificial layer 120 and insulating layer 140 may be etched by the etching mask. An operation of etching the exposed sacrificial layer 120 and insulating layer 140 using the etching mask while trimming the etching mask is repeatedly performed a plurality of times so that a step shape in which the sacrificial layers 120 and the insulating layers 140 are sequentially etched to have a plurality of step heights, may be formed. For example, a first set including adjacent ones of sacrificial layer 120 and the insulating layer 140 may be etched using the etching mask, then the etching mask is trimmed and a second set including adjacent ones of sacrificial layer 120 and the insulating layer 140 may be etched using the trimmed etching mask. This process may continue until the stacked sacrificial layers 120 and insulating layers 140 achieve a step shape.

In some embodiments, each sacrificial layer 120 and each insulating layer 140 form a pair, and individual pairs of the sacrificial layers 120 and the insulating layers 140 may extend along the second direction (Y-direction) to the same length. Exceptionally, the first insulating layer 141 that extends to the same length may be additionally disposed under the first sacrificial layer 121 disposed in a bottommost position in the third direction (Z-direction).

Figure 7C:
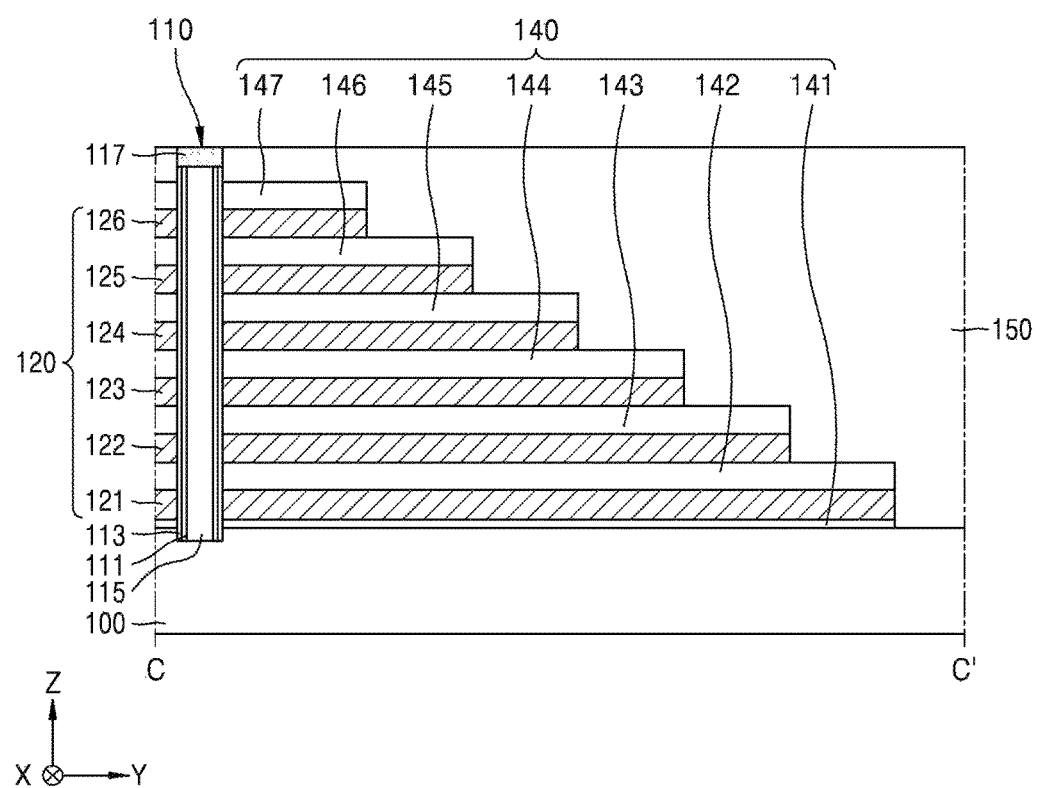

Referring to FIG. 7C, a molding insulating layer 150, which covers the step shape and has a substantially flat top surface, may be formed. A channel structure 110 may also be formed to extend through the sacrificial layers 120 and the insulating layers 140, with the top surface of the channel structure 110 having a flat surface.

The molding insulating layer 150 may be disposed on the plurality of sacrificial layers 121 to 126 and the plurality of insulating layers 141 to 147, which form a step shape. The molding insulating layer 150 may cover top and end surfaces of each pair of adjacent sacrificial layers 120 and insulating layers 140.

The molding insulating layer 150 may include at least one selected from the group consisting of a high density plasma (HDP) oxide layer, a tetra ethyl ortho silicate (TEOS), plasma enhanced-TEOS (PE-TEOS), $O_3$-TEOS, undoped silicate glass (USG), phospho silicate glass (PSG), boro silicate glass (BSG), boro phospho silicate glass (BPSG), fluoride silicate glass (FSG), spin on glass (SOG), and tonen silazene (TOSZ), for example.

In some embodiment, a TEOS oxide layer may be used to form the molding insulating layer 150. The molding insulating layer 150 is formed as the TEOS oxide layer having a high formation speed so that a time required for an operation of forming the molding insulating layer 150 may be reduced and the entire efficiency of a manufacturing process may be improved. In other embodiments, a lower insulating layer (not shown) including a HDP layer may be formed before the molding insulating layer.

Next, a channel structure 110 may be formed. In order to form the channel structure 110, an opening may be formed through the sacrificial layers 120 and the insulating layers 140 in the third direction (Z-direction). A plurality of openings may be provided according to the number of the channel structures 110. For example, one opening may be provided for each channel structure 110. The plurality of openings may be disposed along a zigzag and/or straight line in a plane that extends in the first direction (X-direction) and the second direction (Y-direction) and may be spaced apart from each other in the plane. The plurality of openings may be formed by exposing only a region in which the plurality of openings are disposed, using an etching mask (not shown) and by anisotropically etching the exposed region. Each of the plurality of openings may extend to the top surface of the substrate 100, exposing the top surface of the substrate 100, or may extend below the top surface of the substrate 100, creating a recess in the substrate 100 to a predetermined depth.

A gate dielectric layer 113, including a blocking layer, a charge-storing layer, and a tunneling layer, may be formed on an inner surface and a bottom surface of each of the plurality of openings using atomic layer deposition (ALD). For example, the gate dielectric layer 113 may be formed along a portion of the inner surface of the opening extending to the top surface of the substrate 100 or to the top and side surfaces of the recessed area of the substrate 100. The blocking layer, the charge-storing layer, and the tunneling layer may be sequentially disposed from a region adjacent to the sacrificial layers 120 and the insulating layers 140.

A channel region 111 may be disposed inside the gate dielectric layer 113. The channel region 111 may be formed with a predetermined thickness, for example, a thickness in the range of 1/50 to 1/5 of a width of each of the plurality of openings. The channel region 111 may be formed of polycrystalline Si or monocrystalline Si. The channel region 111 may be formed by ALD or chemical vapor deposition (CVD). The channel region 111 may be in direct contact with the substrate 100 and connected thereto at a bottom surface of each of the plurality of openings. For example, the channel region 111 may be formed along a portion of the inner surface of the gate dielectric layer 113 extending to the top surface of the substrate 100 or to the top surface of the recessed area of the substrate 100.

A buried insulating layer 115 may be filled in the channel region 111. Alternatively, a hydrogen annealing process of performing heat treatment on a structure having the channel region 111 formed therein at a gas atmosphere including hydrogen or heavy hydrogen may be further performed before the buried insulating layer 115 is formed. Through the hydrogen annealing process, a most part of crystalline defects that exist in the channel region 111 may be eliminated.

In other embodiments, the channel structure 110 may be different from the above-described structure. For example, after a plurality of openings for forming the channel structure 110 are provided, the channel region 111 may be formed without performing an operation of forming the gate dielectric layer 113, and the buried insulating layer 115 may be formed inside the channel region 111. In this case, the gate dielectric layer 113 may be formed before an operation of forming gate electrode layers (see, e.g., gate electrode layers 130 of FIG. 7F) is performed, and may surround the gate electrode layers (see, e.g., gate electrode layers 130 of FIG. 7F).

Next, a conductive material may be formed on the channel region 111, the gate dielectric layer 113, and the buried insulating layer 115. A planarization process is performed on the conductive material so that an upper conductive layer 117 connected to the channel region 111 may be formed. A top surface of the upper conductive layer 117 may be at a same vertical level as the top surface of the molding insulating layer 150.

Figure 7D:
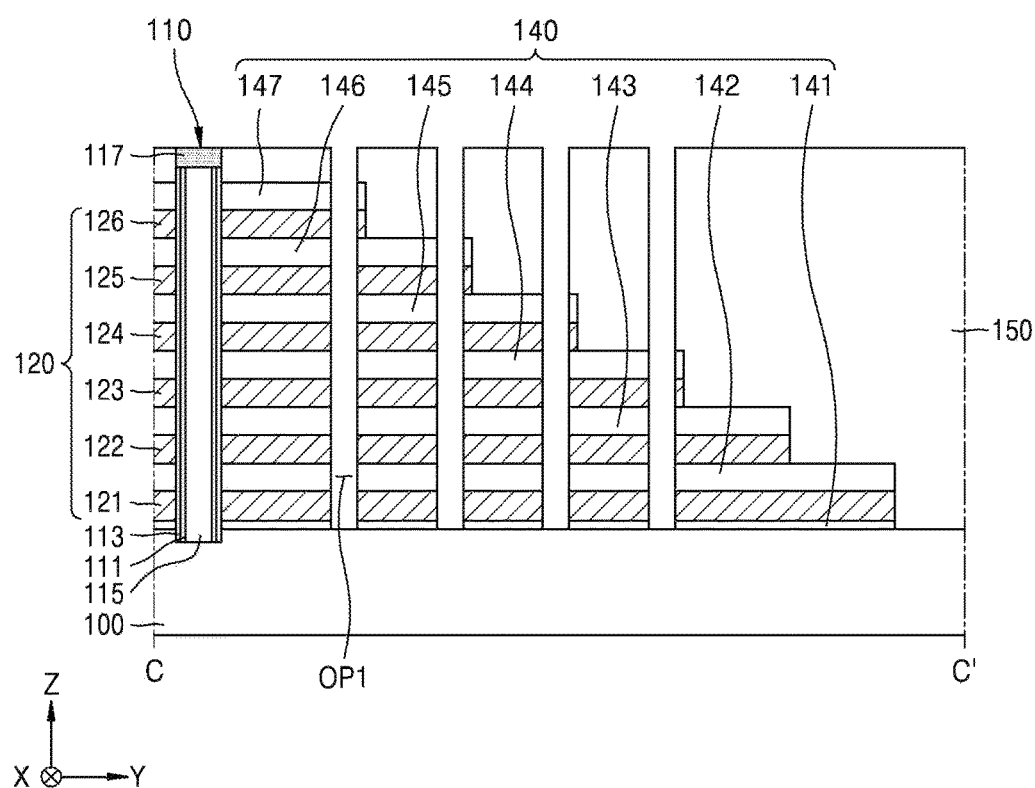

Referring to FIG. 7D, a first open region OP1 for exposing the other portion of the top surface of the substrate 100 may be formed from the structure of FIG. 7C.

Only a region in which the first open region OP1 is disposed, may be exposed using an etching mask (not shown), and the exposed region may be anisotropically etched so that the first open region OP1 may be formed. The first open region OP1 may expose the top surface of the substrate 100 or recess the substrate 100 by a predetermined depth.

In some embodiment, the first open region OP1 may extend in the second direction (Y-direction) in an uneven form. The first open region OP1 may extend to have a cross-section at predetermined intervals along the step shape of the sacrificial layer 120 and the insulating layer 140. A level of the bottom surface of the first open region OP1 may be substantially the same as the level of the top surface of the substrate 100. However, embodiments are not limited thereto.

The first open region OP1 may extend not simply in one direction but in an uneven form. For example, in some embodiments, the first open region OP1 may have first linear portions extending entirely in the Y-direction and second linear portions extending entirely in the X-direction, with the first and second linear portions having the same height in the Z-direction. Thus, due to the stack structure of the sacrificial layers 120 and the insulating layers 140, unidirectional stress to be applied to the substrate 100 is removed so that a warpage phenomenon of the substrate 100 may be alleviated, and a collapse phenomenon of the stack structure of the sacrificial layers 120 and the insulating layers 140 may be prevented from occurring.

Figure 7E:
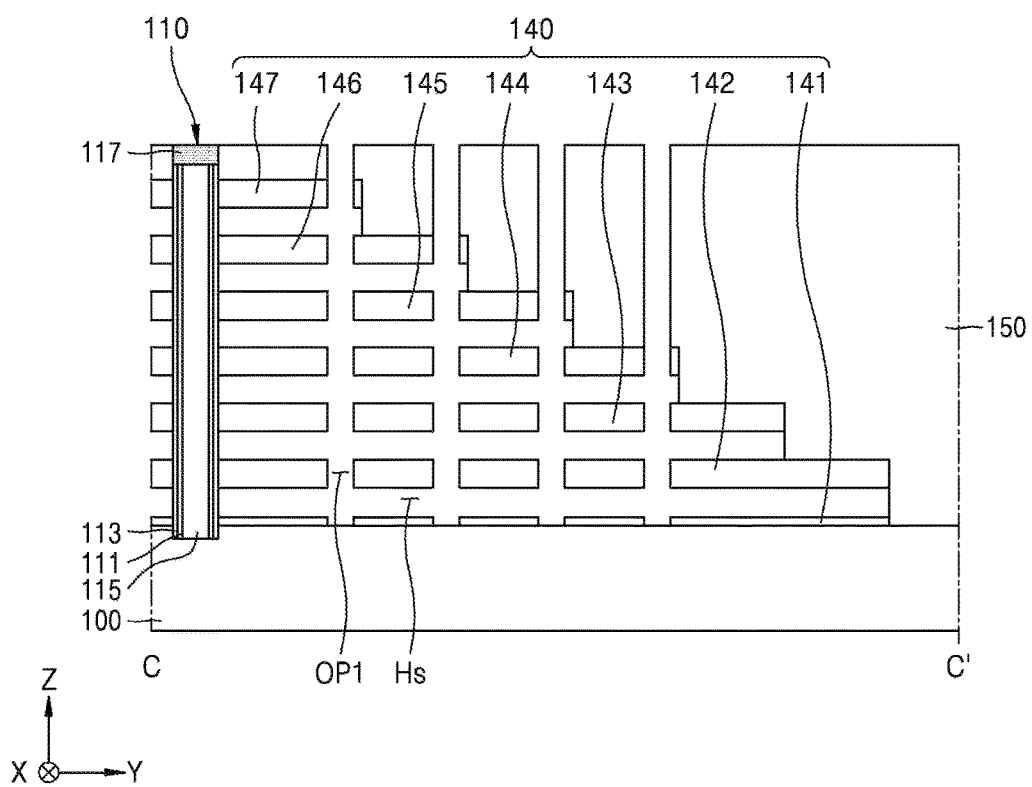

Referring to FIG. 7E, a sacrificial layer (see, e.g., sacrificial layer 120 of FIG. 7D) may be removed to form a lateral opening Hs.

As the sacrificial layer (see, e.g., sacrificial layer 120 of FIG. 7D) is selectively removed by a wet etching process, a plurality of lateral openings Hs may be disposed between the insulating layers 140. Each lateral opening Hs may be an opening between pairs of the stacked insulating layers 140. A portion of the gate dielectric layer 113 may be exposed through the plurality of lateral openings Hs.

An operation of forming the lateral openings Hs may include an operation of horizontally etching the sacrificial layer (see, e.g., sacrificial layer 120 of FIG. 7D) using an etching recipe having etch selectivity with respect to the insulating layer 140. For example, when the sacrificial layer (see, e.g., sacrificial layer 120 of FIG. 7D) is a silicon oxide layer and the insulating layer 140 is a silicon oxide layer, the horizontally-etching operation may be performed using an etchant including phosphoric acid.

Figure 7F:
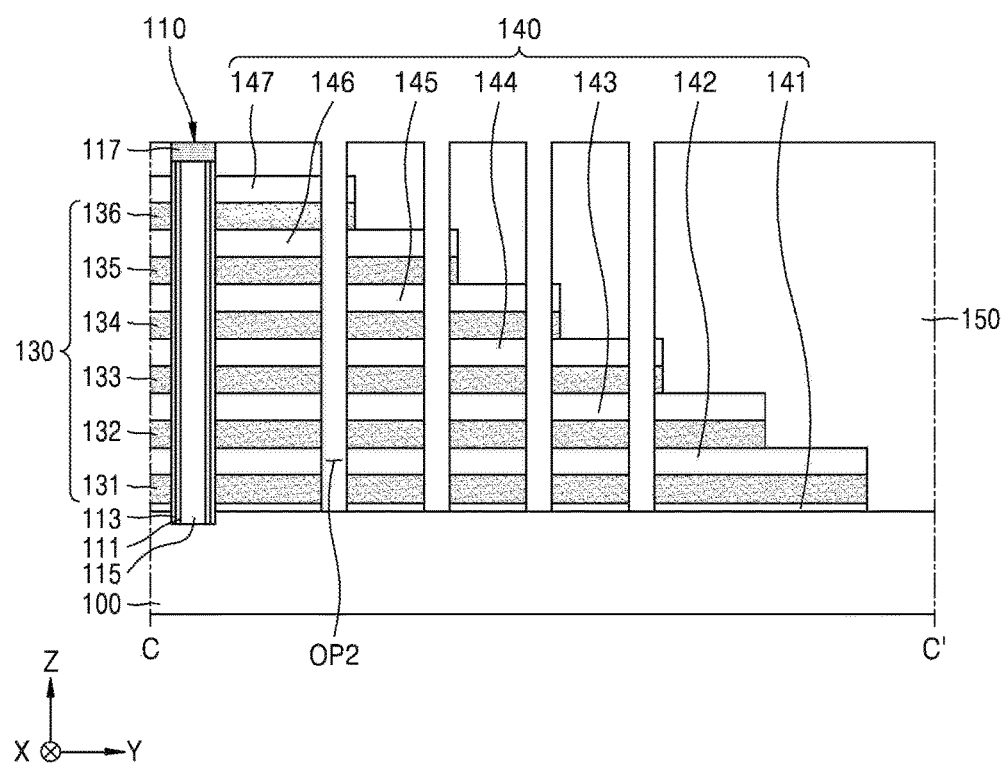

Referring to FIG. 7F, a plurality of gate electrode layers 130 (e.g., gate electrode layers 131 to 136) may be formed within the plurality of lateral openings (see, e.g., lateral openings Hs of FIG. 7E).

Each of the gate electrode layers 130 may include a metal, polycrystalline Si, or a metal silicide material. The metal silicide material may be a metal silicide material selected from the group consisting of cobalt (Co), nickel (Ni), hafnium (Hf), platinum (Pt), tungsten (W), and titanium (Ti), or a combination thereof. When the gate electrode layers 130 include the metal silicide material, after Si is buried within the lateral openings (see, e.g., lateral openings Hs of FIG. 7E), an additional metal layer may be formed so that a silicidation process may be performed and thus the gate electrode layers 130 may be formed.

After the gate electrode layers 130 are formed, the material for forming the gate electrode layers 130 formed within the first open region (see, e.g., first open regions OP1 of FIG. 7E) may be removed by performing an additional process in such a way that the gate electrode layers 130 may be disposed only within the lateral openings (see, e.g., lateral openings Hs of FIG. 7E). Thus, a second open region OP2 may be formed.

According to certain exemplary embodiments, because the first open region (see, e.g., first open regions OP1 of FIG. 7E) is formed in an uneven form and thus has a relatively large area compared to the case where the first open region (see, e.g., first open regions OP1 of FIG. 7E) is formed in a straight line, the material for forming the gate electrode layers 130 may be relatively easily introduced into the lateral openings (see, e.g., lateral openings Hs of FIG. 7E). Thus, even when the lateral openings (see, e.g., lateral openings Hs of FIG. 7E) in the third direction (Z-direction) are relatively small, the gate electrode layers 130 may be stably formed.

In other embodiments, before the gate electrode layers 130 are formed, the gate dielectric layer 113 may be conformally formed within the lateral openings Hs to a predetermined thickness.

Figure 7G:
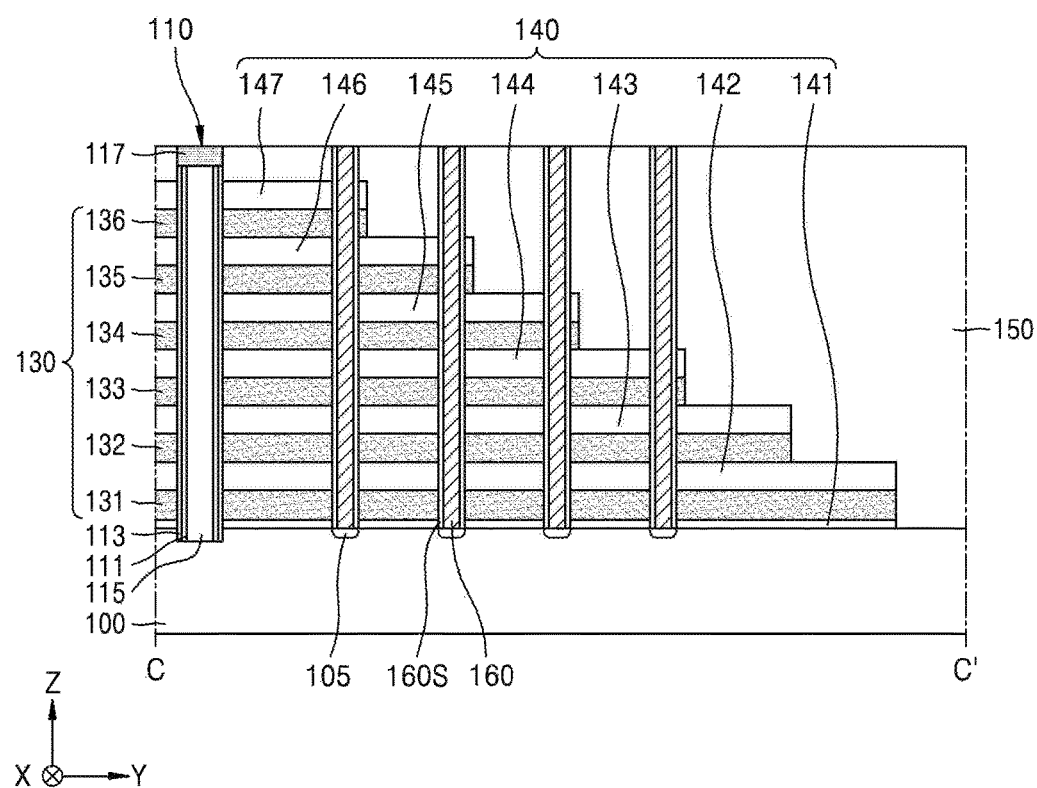

Referring to FIG. 7G, source regions 105 may be formed in the substrate 100 within the second open region (see, e.g., second open regions OP2 of FIG. 7F), and conductive lines 160 may be formed on the source regions 105.

First, an impurity is injected into the substrate 100 through the second open region (see, e.g., second open regions OP2 of FIG. 7F) so that the source regions 105 may be formed adjacent to the top surface of the substrate 100 so as to extend in the second direction (Y-direction). The source regions 105 may have the same conductivity as the conductivity of the substrate 100 or an opposite conductivity thereto. When the source regions 105 have the opposite conductivity to that of the substrate 100, the source regions 105 and the substrate 100 may constitute PN-junction. In some embodiment, the source regions 105 may be connected to each other and may be in an equipotential state.

Next, spacers 160S may be formed at sidewalls of the second open region (see, e.g., second open regions OP2 of FIG. 7F). The spacers 160S may be formed of an insulating material having etch selectivity with respect to the material for the gate electrode layers 130. The insulating material may be buried in the second open region (see, e.g., second open regions OP2 of FIG. 7F) and then, a portion of the insulating material may be removed by anisotropic etching so that the spacers 160S may be formed. Anisotropic etching is excessively performed so that the top surface of the source regions 105 may be recessed. For example, anisotropic etching may be performed so as to etch into a top surface of the substrate 100 creating a recessed area for the source regions 105.

Next, a conductive material is buried in a region partitioned by the spacers 160S so that conductive lines 160 that are in contact with the source regions 105 may be formed. In some embodiment, in order to reduce a contact resistance with the source regions 105 and prevent diffusion of a material for forming the conductive lines 160, a barrier metal layer (not shown) may be firstly formed before the conductive lines 160 are formed. For example, a barrier metal layer may be formed on the inner sidewalls of the spacers 160S.

Figure 7H:
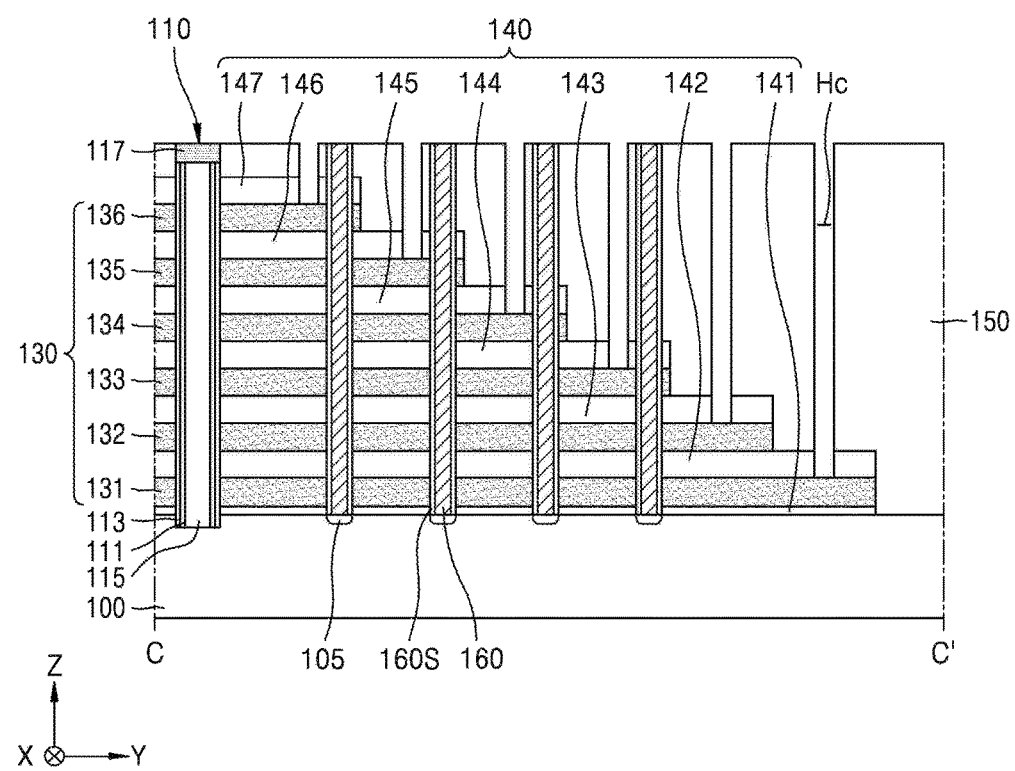

Referring to FIG. 7H, a plurality of contact holes Hc for forming the contact plugs (see, e.g., contact plugs 170 of FIG. 7I) may be formed.

Portions of the molding insulating layer 150 and the respective insulating layer 140 are removed so that each of the gate electrode layers 131 to 136 may be exposed. Thus, the plurality of contact holes Hc may be formed. The plurality of contact holes Hc may be formed when only a region in which the plurality of contact holes Hc are disposed is exposed and the exposed region is anisotropically etched by an etching mask (not shown).

In more detail, a first etching process may be performed using the etching mask so as to remove portions of the molding insulating layer 150 and the insulating layer 140 until a bottom surface of each of the plurality of contact holes Hc reaches the top surface of the corresponding gate electrode layer 130. Because the gate electrode layers 130 are formed of a material having a high selection ratio with respect to materials for forming the molding insulating layer 150 and the insulating layer 140, extension of the plurality of contact holes Hc may be substantially stopped by the gate electrode layers 130. That is, the gate electrode layers 130 may serve as an etching stop layer.

Figure 7I:
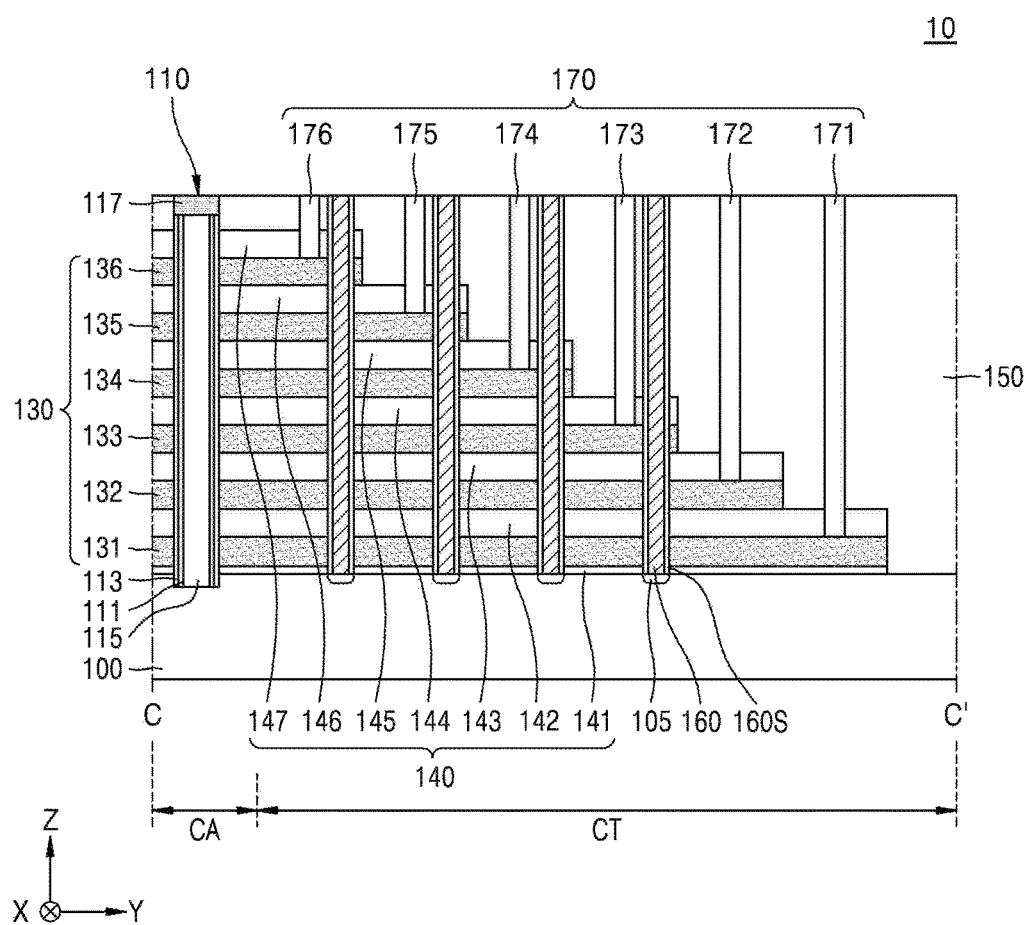

Referring to FIG. 7I, a plurality of contact plugs 170 (e.g., contact plugs 171 to 176) connected to the plurality of gate electrode layers 131 to 136 may be formed.

After the conductive material is formed to fill the contact holes (see, e.g., contact holes Hc of FIG. 7H), a planarization process may be performed so that the molding insulating layer 150 may be exposed, thereby forming the contact plugs 170. The contact plugs 170 may include a conductive material, such as a metal, for example, W. The contact plugs 170 may be disposed along a straight line in the second direction (Y-direction).

As described above, the semiconductor device 10 that is a vertical type semiconductor memory device having a 3D structure, may form the conductive lines 160 disposed in the step-shaped contact connection region CT, i.e., the common source line CSL in uneven patterns. Thus, a collapse phenomenon of the common source line CSL may be prevented from occurring, and the gate electrode layers 130 may be easily formed. As a result, the semiconductor device 10 having improved reliability of a device and improved economic feasibility of manufacture may be provided.

Figure 8:
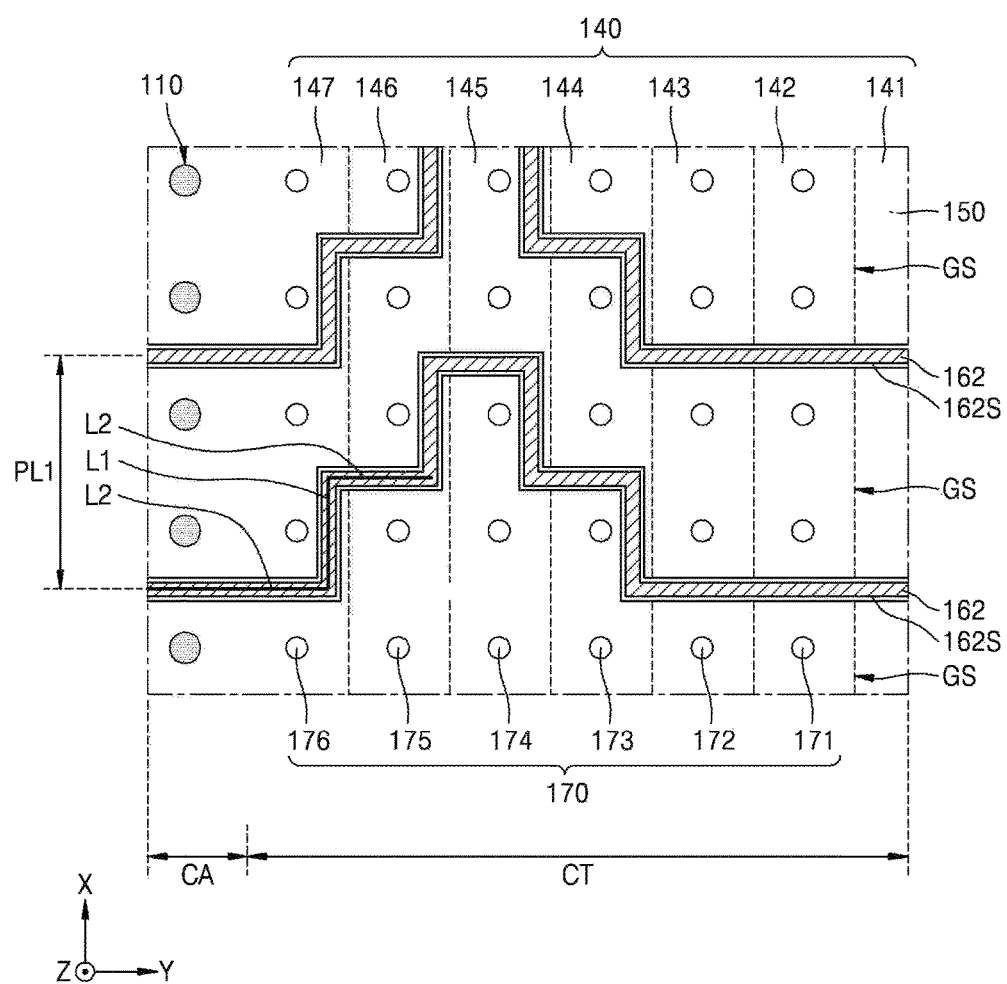
FIG. 8 is a plan view of a contact connection region of a semiconductor device, according to another exemplary embodiment.

FIG. 8 is a plan view of a contact connection region of a semiconductor device, according to another example embodiment.

Referring to FIG. 8, a plurality of conductive lines 162 may be disposed in a contact connection region CT of a semiconductor device 20, may be disposed between the gate stack structures GS that extend in the second direction (Y-direction), may be spaced apart from each other in the first direction (X-direction), and may extend in the second direction (Y-direction) in a dual uneven form. For example, the plurality of conductive lines 162 may include multiple linear segments that extend in the X-direction with the conductive lines 162 having a pyramidal shape. Other elements of FIG. 8 are substantially the same as those of the above description of FIG. 4 and thus redundant descriptions thereof will be omitted.

The conductive lines 162 may be integrally formed between the gate stack structures GS. The dual uneven shape may be an integral shape in which the conductive lines 162 that extend along first straight lines L1 in the first direction (X-direction) and the conductive lines 162 that extend along second straight lines L2 in the second direction (Y-direction) are alternately and substantially connected to one another at a right angle and rise in the first direction (X-direction). For each protrusion PS or depression DS, the conductive lines 162 may include linear segments that span two contact plugs 170 in the X-direction and three contact plugs 170 in the Y-direction.

Also, the plurality of conductive lines 162 may be spaced apart from one another in the first direction (X-direction) by the first distance PL1.

Contact plugs 170 may be disposed on the gate stack structures GS in the contact connection region CT along a straight line in the second direction (Y-direction). Thus, for example, even when the conductive lines 162 are formed in a dual uneven form, this may not affect the arrangement of the contact plugs 170.

A cell array region CA of the semiconductor device 20 may be the same as the cell array region CA of FIG. 6 of the semiconductor device 10 of FIG. 6. For example, the plurality of conductive lines 162 may extend in a straight line in the second direction (Y-direction) in the cell array region CA of the semiconductor device 20.

Figure 9:
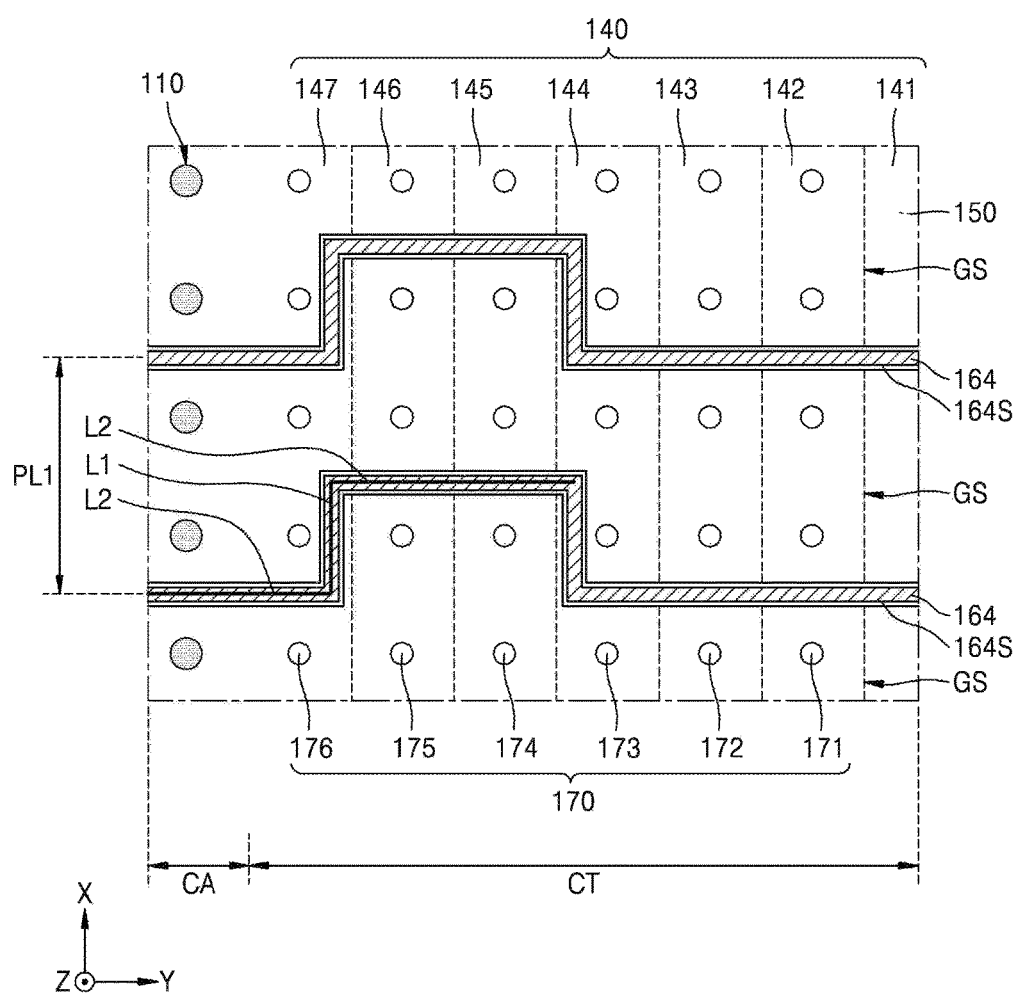
FIG. 9 is a plan view of a contact connection region of a semiconductor device, according to another exemplary embodiment.

FIG. 9 is a plan view of a contact connection region of a semiconductor device, according to another example embodiment.

Referring to FIG. 9, a plurality of conductive lines 164 may be disposed in a contact connection region CT of a semiconductor device 30, may be disposed between gate stack structures GS that extend in the second direction (Y-direction), may be spaced apart from one another in the first direction (X-direction), and may extend in an uneven form with a large distance in the second direction (Y-direction). For each protrusion PS or depression DS, the conductive lines 164 may span one contact plug 170 in the X-direction and two contact plugs 170 in the Y-direction.

Other elements of FIG. 9 are substantially the same as those of the above description of FIG. 4 and thus, redundant descriptions thereof will be omitted.

The conductive lines 164 may be integrally formed between the gate stack structures GS. The uneven shape with the large distance may be an integral shape in which the conductive lines 164 that extend along first straight lines L1 in the first direction (X-direction) and the conductive lines 164 that extend along second straight lines L2 in the second direction (Y-direction) are alternately and substantially connected to each other at a right angle and the conductive lines 164 that extend along second straight lines L2 cross an insulating layer 140 of at least two step layers.

Also, the plurality of conductive lines 164 may be spaced apart from one another in the first direction (X-direction) while having the first distance PL1.

Contact plugs 170 may be disposed on the gate stack structures GS in the contact connection region CT in the second direction (Y-direction) along a straight line. Thus, for example, even when the conductive lines 164 are formed in an uneven form with a large distance, this may not affect the arrangement of the contact plugs 170.

The cell array region CA of the semiconductor device 30 may be the same as the cell array region CA of FIG. 6 of the semiconductor device 10 of FIG. 6. For example, the plurality of conductive lines 164 may extend in the second direction (Y-direction) in the form of a straight line in the cell array region CA of the semiconductor device 30.

Figure 10:
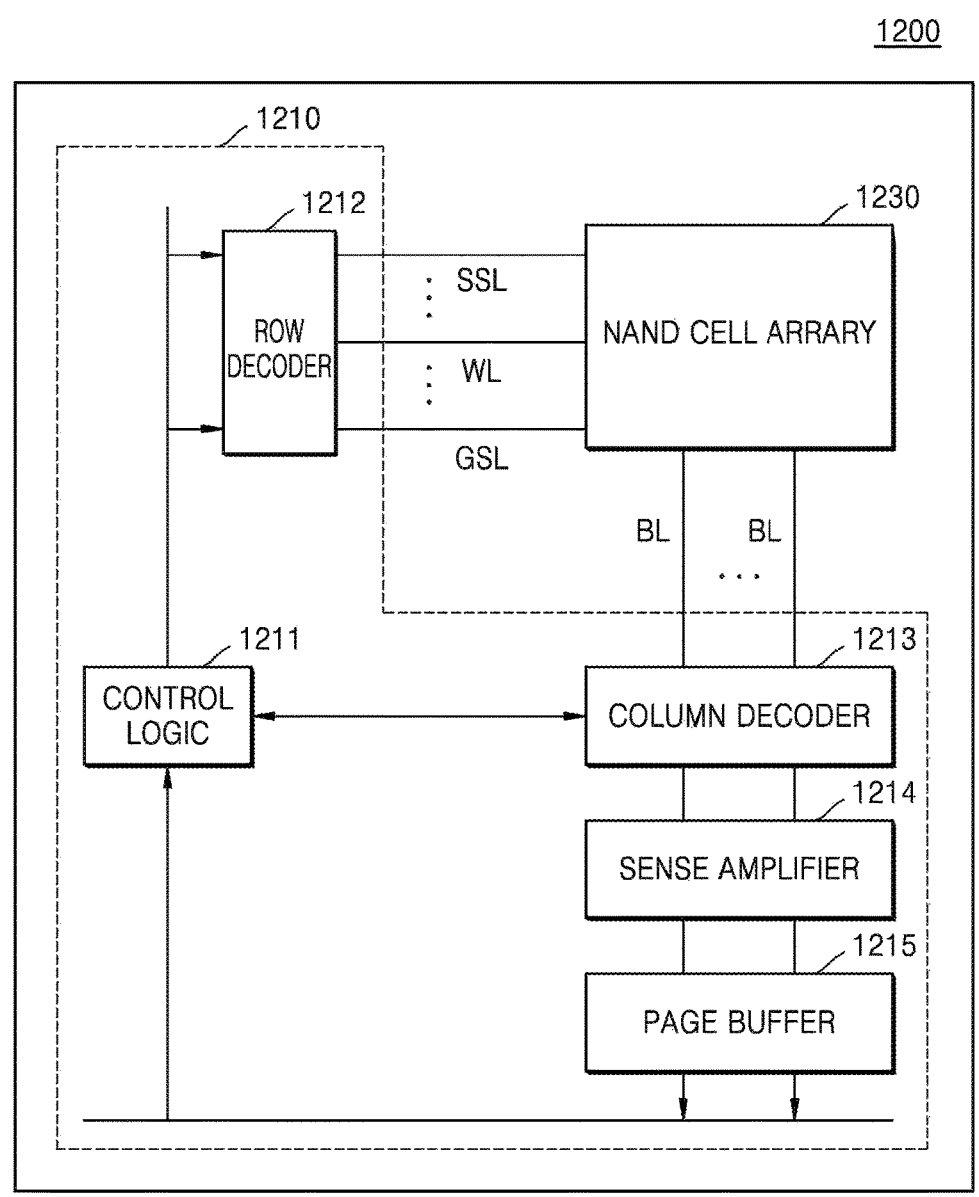
FIG. 10 is a schematic block diagram of a semiconductor device, according to an exemplary embodiment.

FIG. 10 is a schematic block diagram of a semiconductor device, according to an example embodiment.

Referring to FIG. 10, in a semiconductor device 1200, a NAND cell array 1230 may be coupled to a core circuit unit 1210. For example, the NAND cell array 1230 may include the above-described semiconductor devices 10, 20, and 30. The core circuit unit 1210 may include a control logic 1211, a row decoder 1212, a column decoder 1213, a sense amplifier 1214, and a page buffer 1215.

The control logic 1211 may communicate with the row decoder 1212, the column decoder 1213, and the page buffer 1215. The row decoder 1212 may communicate with the NAND cell array 1230 via a plurality of string select lines SSL, a plurality of word lines WL, and a plurality of ground select lines GSL. The column decoder 1213 may communicate with the NAND cell array 1230 via a plurality of bit lines BL. The sense amplifier 1214 may be connected to the column decoder 1213 when signals are output from the NAND cell array 1230. The sense amplifier 1214 may not be connected to the column decoder 1213 when the signals are transmitted to the NAND cell array 1230.

For example, the control logic 1211 may transmit a row address signal to the row decoder 1212, and the row decoder 1212 may decode the row address signal so as to transmit the decoded row address signal to the NAND cell array 1230 via the plurality of string select lines SSL, the plurality of word lines WL, and the plurality of ground select lines GSL. The control logic 1211 may transmit a column address signal to the column decoder 1213 or the page buffer 1215, and the column decoder 1213 may decode the column address signal so as to transmit the decoded column address signal to the NAND cell array 1230 via the plurality of bit lines BL. The signal of the NAND cell array 1230 may be transmitted to the sense amplifier 1214 via the column decoder 1213 and may be amplified by the sense amplifier 1214 and transmitted to the control logic 1211 after passing through the page buffer 1215.

While the inventive concepts have been particularly shown and described with reference to embodiments thereof, it will be understood that various changes in form and details may be made therein without departing from the spirit and scope of the following claims.

What is claimed is:

1. A semiconductor device comprising:
a substrate comprising a top surface extending in a first direction and a second direction that are perpendicular to each other;
gate stack structures disposed on the substrate, spaced apart from one another in the first direction, and extending in the second direction;
a first region in which levels of top surfaces of the gate stack structures are constant;
a second region in which levels of top surfaces of the gate stack structures are stepped, the second region surrounding at least a portion of the first region; and
conductive lines disposed in the second region between the gate stack structures, each conductive line including first linear segments extending lengthwise in the first direction and second linear segments extending lengthwise in the second direction, when viewed in plan view,
wherein, in the first direction, the conductive lines cross at least one contact plug of contact plugs disposed in the second direction along a straight line.

2. The semiconductor device of claim 1, wherein the first linear segments extend along first straight lines in the first direction and the second linear segments extend along second straight lines in the second direction, and
wherein the first linear segments and the second linear segments are alternately connected to one another, thus having rectangular protrusions and depressed portions.

3. The semiconductor device of claim 2, wherein virtual straight lines connecting the second straight lines are spaced apart from one another in the first direction by a same distance.

4. The semiconductor device of claim 2, wherein each of the gate stack structures comprises gate electrode layers stacked perpendicular to the top surface of the substrate, and
wherein in the second region, the gate electrode layers face one conductive line of the conductive lines at three or more surfaces of the one conductive line.

5. The semiconductor device of claim 1, wherein the conductive lines are integrally formed between the gate stack structures.

6. The semiconductor device of claim 1, wherein, in the second region, the contact plugs are disposed on the gate stack structures in the second direction along the straight line, and levels of bottom surfaces of the contact plugs are sequentially closer to the substrate.

7. The semiconductor device of claim 1, wherein, in the first region, the conductive lines are disposed between the gate stack structures and extend in the second direction in a straight line.

8. The semiconductor device of claim 7, wherein, in the first region, the gate stack structures have lateral sides that extend in the second direction in a straight line, and
wherein in the second region, the gate stack structures have lateral sides that extend in the second direction in an uneven form.

9. The semiconductor device of claim 1, wherein conductive lines are common source lines (CSLs).

10. A semiconductor device comprising:
a substrate comprising a cell array region and a contact connection region that surrounds the cell array region;
gate stack structures spaced apart from one another in a first direction parallel to a top surface of the substrate; and
common source lines disposed in a space defined by two adjacent gate stack structures of the gate stack structures,
wherein, in the contact connection region, vertical levels of top surfaces of the gate stack structures sequentially decrease as a distance from the cell array region increases, and the gate stack structures have lateral sides that extend in a second direction perpendicular to the first direction and include rectangular protrusions and depressions, and
wherein levels of top surfaces of the common source lines are constant and are formed in accordance with shapes of the lateral sides of the gate stack structures, and
wherein widths of the common source lines are constant.

11. The semiconductor device of claim 10, wherein the rectangular protrusions and depressions of the lateral sides of two adjacent gate stack structures are disposed in parallel to one another, and
wherein the lateral sides of the two adjacent gate stack structures face each other.

12. The semiconductor device of claim 10, wherein, in the cell array region, the vertical levels of the top surfaces of the gate stack structures are constant, the lateral sides of the gate stack structures extend in the second direction in a straight line, levels of top surfaces of the common source lines are constant, and the common source lines are formed along the lateral sides of the gate stack structures.

13. The semiconductor device of claim 10, wherein an insulating layer is disposed between the gate stack structures and the common source lines.

14. A semiconductor device comprising:
a substrate comprising a top surface that extends in a first direction and a second direction perpendicular to the first direction;
vertical structures configured to extend in a third direction perpendicular to the top surface of the substrate;
word lines configured to surround the vertical structures and stacked so as to be spaced apart from one another in the third direction; and
conductive lines configured to vertically intersect the word lines and having first lateral side pairs that extend in the first direction, second lateral side pairs that extend in the second direction, and top surfaces that extend in a flat form in a contact region, the contact region being an area in which a number of stacks of the word lines decreases,
wherein each first lateral side pair includes two first lateral sidewalls parallel to one another and each second lateral side pair includes two second lateral sidewalls parallel to one another, and
wherein one first lateral side pair is formed at a right angle with two second lateral side pairs and connects the two second lateral pairs.

15. The semiconductor device of claim 14, wherein, in the contact region, contact plugs having bottom surfaces of which levels sequentially decrease are disposed in the second direction along a straight line, and the conductive lines are interposed between the contact plugs in the first direction and the second direction.

16. The semiconductor device of claim 14, wherein, in the contact region, the word lines face at least three surfaces of one conductive line of the conductive lines.

17. The semiconductor device of claim 14, wherein, in a cell array region, the lateral sides of the conductive lines extend in the second direction in a straight line, and the top surfaces of the conductive lines extend in a flat form, the cell array region being an area in which a number of stacks of the word lines is constant.

18. The semiconductor device of claim 17, wherein, in the cell array region, the word lines face one conductive line of the conductive lines at one surface thereof.

\* \* \* \* \*